(12) United States Patent
Dorfman

(10) Patent No.: US 9,012,555 B2
(45) Date of Patent: Apr. 21, 2015

US009012555B2

(54) UV-CURABLE THERMOFORMABLE DIELECTRIC FOR THERMOFORMABLE CIRCUITS

(71) Applicant: E I du Pont de Nemours and Company, Wilmington, DE (US)

(72) Inventor: Jay Robert Dorfman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 14/049,610

(22) Filed: Oct. 9, 2013

(65) Prior Publication Data

US 2014/0350162 A1    Nov. 27, 2014

Related U.S. Application Data

(63) Continuation-in-part of application No. 13/899,738, filed on May 22, 2013.

(51) Int. Cl.

| | | |
|---|---|---|
| *H01L 23/31* | (2006.01) | |
| *H01B 3/44* | (2006.01) | |
| *C09D 175/16* | (2006.01) | |
| *C09D 133/14* | (2006.01) | |
| *H01B 3/30* | (2006.01) | |
| *C08G 18/67* | (2006.01) | |
| *C08F 290/06* | (2006.01) | |
| *H01L 23/29* | (2006.01) | |
| *H01L 23/00* | (2006.01) | |

(52) U.S. Cl.
CPC .............. *H01B 3/447* (2013.01); *H01B 3/302* (2013.01); *C08G 18/672* (2013.01); *C08F 290/067* (2013.01); *C09D 175/16* (2013.01); *H01L 23/293* (2013.01); *H01L 23/564* (2013.01)

(58) Field of Classification Search
CPC ...... C09D 175/16; C09D 133/14; H01L 23/31
USPC ....................................... 524/451; 522/90, 96
See application file for complete search history.

(56) References Cited

U.S. PATENT DOCUMENTS

| | | |
|---|---|---|
| 4,613,560 A | 9/1986 | Dueber et al. |
| 8,329,772 B2 | 12/2012 | Dorfman |
| 2002/0004537 A1* | 1/2002 | Krongauz et al. ............... 522/90 |
| 2004/0152799 A1* | 8/2004 | Miller et al. ................... 522/104 |
| 2005/0101685 A1* | 5/2005 | Krohn .............................. 522/71 |
| 2006/0154082 A1* | 7/2006 | Miller et al. ................ 428/423.1 |
| 2008/0114089 A1* | 5/2008 | Krohn .............................. 522/30 |
| 2009/0301561 A1* | 12/2009 | Wang et al. ................... 136/256 |
| 2011/0288197 A1 | 11/2011 | Dorfman |

OTHER PUBLICATIONS (PCT/US/2014/038301 Filed May 16, 2014) International Search Report and Written Opinion.

* cited by examiner

*Primary Examiner* — Vu A Nguyen

(57) ABSTRACT

This invention is directed to a polymer thick film UV-curable thermoformable dielectric composition. Dielectrics made from the composition can be used in various electronic applications to protect electrical elements and particularly to insulate and protect both the conductive thermoformable silver and the polycarbonate substrate below it in capacitive switch applications. The thermoformed capacitive switch circuit may be subsequently subjected to an injection molding process.

12 Claims, No Drawings

UV-CURABLE THERMOFORMABLE DIELECTRIC FOR THERMOFORMABLE CIRCUITS

FIELD OF THE INVENTION

This invention is directed to a polymer thick film UV-curable thermoformable dielectric composition. Dielectrics made from the composition can be used in various electronic applications to protect electrical elements and particularly to insulate and protect the conductive thermoformable silver above and below it from moisture in capacitive switches.

BACKGROUND OF THE INVENTION

Dielectrics have long been used to protect electrical elements. They have also been used as isolating layers. Although they have been used for years in these types of applications, the use of ultraviolet (UV)-curable dielectrics during thermoforming procedures is not common. This is particularly important in thermoformable capacitive circuits where highly conductive silver is used and moisture must be prevented from interacting with the silver conductor. One of the purposes of this invention is to alleviate these issues and produce a thermoformable capacitive construction in which the printed silver can be used on a substrate of choice such as a polycarbonate. Another purpose is to be able to produce complex multilayer circuits with silver below and above the dielectric, thus forming reliable crossover circuitry even after thermoforming.

SUMMARY OF THE INVENTION

This invention relates to a polymer thick film UV-curable thermoformable dielectric composition comprising:
(a) 20-60 wt % acrylated urethane oligomer with a percent elongation of at least 100%;
(b) 5-30 wt % alkyl acrylate monomer;
(c) 1-15 wt % acrylated amine; and
(d) 5-35 wt % inorganic powder;
wherein the wt % are based on the total weight of the polymer thick film UV-curable thermoformable dielectric composition.

The invention is further directed to using the polymer thick film (PTF) UV-curable dielectric to form a protective and/or insulating layer in thermoformable capacitive electrical circuits.

DETAILED DESCRIPTION OF INVENTION

The invention relates to a polymer thick film UV-curable dielectric composition for use in thermoforming electrical circuits. A layer of dielectric is printed and UV-cured on a substrate so as to protect that substrate from other layers that are subsequently deposited on the UV-curable dielectric. Such a layer also prevents moisture from reaching water sensitive layers deposited on the UV-cured dielectric layer.

The substrate commonly used in polymer thick film thermoformable capacitive circuits is polycarbonate (PC). PC is generally preferred since it can be readily thermoformed. However, PC is very sensitive to the solvents used in the layers deposited on it. An improper choice of solvent will result in cracking or crazing in the PC substrate.

The polymer thick film (PTF) UV-curable dielectric composition is comprised of (i) a high elongation urethane oligomer, (ii) an acrylate monomer, (iii) an acrylated amine and iv) an inorganic powder. Additionally printing aids may be added to improve the composition.

PTF UV-Curable Dielectric Composition

Acrylated Urethane Oligomer

The (PTF) UV-curable dielectric composition of the invention comprises a urethane resin oligomer, i.e., an acrylated urethane oligomer. Due to the stresses induced in thermoforming, the oligomer should have a percent elongation of at least 100%.

Percent elongation is defined in the usual way:

$$\text{Percent Elongation} = \frac{\text{Final Length} - \text{Initial Length}}{\text{Initial Length}} \times 100$$

The PTF UV-curable dielectric composition is comprised of 20-60 weight percent (wt %) acrylated urethane oligomer, based on the total weight of the PTF UV-curable dielectric composition. In one embodiment the PTF UV-curable dielectric composition is comprised of 35-45 wt % acrylated urethane oligomer.

Alkyl Acrylates

Alkyl acrylates constitute an important component of the PTF UV-curable dielectric composition of the invention. The alkyl acrylates must be liquid at room temperature. Both mono- and multi-functional acrylates can be used in the invention. However, the amount of tri- and higher functionality acrylates must be limited to 5 wt % or less of the PTF UV-curable dielectric composition in order to avoid excessive crosslinking and shrinkage of the composition. In one embodiment the PTF UV-curable dielectric composition is comprised of only mono- and di-functional liquid alkyl acrylates in an amount of 5-30 wt %, based on the total weight of the PTF UV-curable dielectric composition. In another embodiment the PTF UV-curable dielectric composition is comprised of only mono- and di-functional liquid alkyl acrylates in an amount of 10 to 20% wt.

Suitable alkyl acrylates include but are not limited to acrylates and the corresponding methacrylates: allyl acrylatetetrahydrofurfuryl acrylate, triethyleneglycol diacrylate, ethyleneglycol diacrylate, polyethyleneglycol diacrylate, 1,3-butyleneglycol diacrylate, 1,4-butanediol diacrylate, diethyleneglycol diacrylate, 1,6-hexanediol diacrylate, neopentylglycol diacrylate, 2-(2-ethoxyethoxy)ethyl acrylate, tetraethyleneglycol diacrylate, pentaerythritol tetraacrylate, 2-phenoxyethyl acrylate, ethoxylated bisphenol A diacrylate, trimethylolpropane triacrylate, glycidyl acrylate isodecyl acrylate, pentaerythritol triacrylate, 2-(N,N-diethylamino) ethyl acrylate, hydroxy lower alkyl acrylates such as hydroxyethyl acrylate, hydroxypropyl acrylate, hydroxyhexyl acrylate, benzoyloxyalkyl acrylates such as benzoyloxyethyl acrylate and benzoyloxyhexyl acrylate, cyclohexyl acrylate, n-hexyl acrylate, dicyclopentenylacrylate, N-vinyl-2-pyrrolidone isobornyl acrylate, isooctyl acrylate, n-lauryl acrylate, 2-butoxyethyl acrylate, 2-ethylhexyl acrylate, and 2,2-methyl-(1,3-dioxolan-4-yl)methyl acrylate. In the case of monofunctional acrylates, it is preferred that they be of higher molecular weight and therefore of lower volatility. As can be seen from the above list, the alkyl moiety of the acrylate can be substituted with virtually any inert organic group so long as the resultant acrylate remains liquid at room temperature and is miscible in the above described acrylated oligomers. In one embodiment, the alkyl acrylate is an oxyethylated acrylate monomer.

Acrylated Amine

The PTF UV-curable dielectric composition comprises an acrylated amine which leads to the following advantageous characteristics: (1) rapid UV cure response and (2) enhanced adhesion to substrates such as polycarbonate.

In one embodiment the PTF UV-curable dielectric composition is comprised of 1-15 wt % acrylated amine, based on the total weight of the PTF UV-curable dielectric composition. In another embodiment the PTF UV-curable dielectric composition is comprised of 5-10 wt % acrylated amine.

Inorganic Powders

Inorganic powders such as magnesium silicate (talc) used in the PTF UV-curable dielectric composition to improve adhesion and electrical properties. Other powders such as boron nitride, aluminum nitride, alumina, titanium dioxide, barium titanate, or silica may also be used. Other powders may be used as well. The PTF UV-curable dielectric composition is comprised of 5-35 wt % inorganic powder, based on the total weight of the PTF UV-curable dielectric composition. In one embodiment the PTF UV-curable dielectric composition is comprised of 20-35 wt % inorganic powder. The optimum wt % of each powder is determined by its particle size and density.

Additives

In addition to the above-described primary constituents, the composition of the invention may also contain various secondary components to add to or enhance its properties such as elastomeric polymers, free radical initiators to render the composition curable by UV light, pigments (soluble or insoluble) and various printing aids such as leveling agents, antifoam agents and thickeners. These materials are well known in the art.

Application of the PTF UV-Curable Thermoformable Dielectric

Composition

This Example was carried out to demonstrate that the PTF UV-curable thermoformable dielectric composition can be thermoformed and provide a useful circuit. The PTF UV-curable thermoformable dielectric composition, also referred to as a "paste", is typically deposited on a substrate, such as polycarbonate, that is somewhat impermeable to gases and moisture. The substrate can also be a sheet of a composite material made up of a combination of plastic sheet with optional metallic or dielectric layers deposited thereupon.

The deposition of the PTF UV-curable, thermoformable dielectric composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying.

Capacitive Circuit Construction

The base substrate used is typically 10 mil thick polycarbonate. Typically a layer of the PTF UV-curable thermoformable dielectric composition of the invention is deposited onto the substrate to prevent any moisture permeating the substrate from affecting the silver circuit. A thermoformable conductive silver composition such as DuPont 5043 is then printed and dried for 5 minutes at 130° C. The PTF UV-curable thermoformable dielectric of the invention is printed and UV-cured at 750 mj/cm$^2$. Another silver layer may be printed above the UV-cured thermoformable dielectric to form crossover areas. A subsequent step will then include thermoforming the entire unit which is typical in the production of 3-dimensional circuits. The UV-cured dielectric must not crack during thermoforming, in contrast to most compositions, and still offer circuit protection and isolation of the silver layers. If the UV-curable dielectric is not used, the silver composition will be subject to moisture penetration through the polycarbonate substrate which can lead to reduced lifetime of the functional circuit.

In the course of producing a 3-dimensional capacitive circuit, after the thermoforming step, the final step will often be a molding step in which the finished circuit is formed by injection molding using a resin such as polycarbonate. This process is referred to as in-molding and involves higher temperatures. Depending on the resin chosen, these temperatures can typically exceed 250° C. for 10-30 sec. Thus the choice of the resins used in the PTF composition is critical. The combination of the resins used in the instant PTF composition has been shown to survive the in-mold process and produce fully functional circuitry whereas most resins typically used in PTF compositions will not.

EXAMPLE AND COMPARATIVE EXPERIMENT

Example 1

This Example was carried out to demonstrate that the PTF UV-curable thermoformable dielectric composition of the invention is thermoformable and that its use results in excellent performance.

The PTF UV-curable thermoformable dielectric composition was prepared in the following manner. The organic components were added first followed by the inorganic powders. The composition was mixed at medium speed for 45 min. The composition was then subjected to a three-roll-mill for one cycle at 150 psi.

The composition, based on the total weight of the composition, was:

| | |
|---|---|
| 38.35 wt % | Ebecryl ® 8413 (Cytec, Inc.) |
| 15.00 wt % | Ebecryl ® 110 (Cytec, Inc.) |
| 5.50 wt % | Ebecryl ® 1300 (Cytec, Inc.) |
| 7.20 wt % | Ebecryl ® 7100 (Cytec, Inc.) |
| 0.50 wt % | Silicone Flow Additive |
| 3.00 wt % | Ciba ® Darocur ® 1173 (Ciba Specialty (Chemicals, Inc.) |
| 0.65 wt % | 2,2 diethoxy acetophenone |
| 1.00 wt % | acrylic green dye (Penn Color, Inc.) |

-continued

| 25.00 wt % | Mistron ® Vapor Talc (Imerys Talc) |
| 3.80 wt % | Mistron ® Ultramix Talc (Imerys Talc) |

A circuit was then fabricated as follows: On a 10 mil thick polycarbonate substrate, a blanket print of DuPont silver conductor 5043 (DuPont Co.) was printed with a 200 stainless steel screen and dried at 130° C. for 10 min. in a forced air box oven. A 280 mesh stainless screen was used to print a first layer of the PTF UV-curable thermoformable dielectric composition described above. The printed layer was cured at 750 mj/cm$^2$ using a Hg Vapor bulb. A second layer of the PTF UV-curable thermoformable dielectric composition was then printed and cured as described for the first layer. A pattern of silver lines was printed on the second dielectric layer with DuPont silver paste 5043 using a 280 mesh stainless steel screen. The patterned lines were dried at 130° C. for 10 min. in a forced air box oven. The circuit was inspected and no evidence of crazing or deformation of the underlying substrate was found. The circuit was then subjected to thermoforming conditions (160° C. for 10 sec). Resistance was then measured and recorded. The circuit was inspected to see if there was continuity from the bottom silver layer to the top. The percentage of circuits that were open due to cracking or other effects was calculated. The results are shown in Table I.

Comparative Experiment A

A circuit was produced exactly as described in Example 1. The only difference was that a standard UV-curable PTF dielectric, DuPont 5018 UV Curable Dielectric (DuPont Co.) was used instead of the PTF UV-curable thermoformable dielectric composition of the invention.

The percentage of circuits that were open due to cracking or other effects was calculated. The results are shown in Table I.

TABLE I

|  | % of Open Circuits |
| --- | --- |
| Example 1 | 0.0 |
| Comparative Experiment A | 62.5 |

The improvement in performance as a result of the use of the PTF UV-curable thermoformable dielectric composition of the invention is apparent from the results shown above.

What is claimed is:

1. A polymer thick film UV-curable thermoformable dielectric composition consisting of:
    (a) 20-60 wt % acrylated urethane oligomer with a percent elongation of at least 100%;
    (b) 5-30 wt % alkyl acrylate monomer;
    (c) 1-15 wt % acrylated amine;
    (d) 5-35 wt % inorganic powder; and
    (e) free radical initiator;
wherein the wt % are based on the total weight of the polymer thick film UV-curable thermoformable dielectric composition.

2. The polymer thick film UV-curable thermoformable dielectric composition of claim 1, wherein said alkyl acrylate monomer is an oxyethylated acrylate monomer.

3. The polymer thick film UV-curable thermoformable dielectric composition of claim 1, wherein said inorganic powder is selected from the group consisting of talc, boron nitride, aluminum nitride, alumina, titanium dioxide, barium titanate, and silica.

4. The polymer thick film UV-curable thermoformable dielectric composition of claim 3, wherein said inorganic powder is talc.

5. The polymer thick film UV-curable thermoformable dielectric composition of claim 1, said composition consisting of:
    (a) 35-45 wt % acrylated urethane oligomer with a percent elongation of at least 100%;
    (b) 10-20 wt % alkyl acrylate monomer;
    (c) 5-10 wt % acrylated amine;
    (d) 20-35 wt % inorganic powder; and
    (e) free radical initiator;
wherein the wt % are based on the total weight of the polymer thick film UV-curable thermoformable dielectric composition.

6. The polymer thick film UV-curable thermoformable dielectric composition of claim 5, wherein said alkyl acrylate monomer is an oxyethylated acrylate monomer and said inorganic powder is talc.

7. A capacitive switch circuit comprising a dielectric formed from a polymer thick film UV-curable thermoformable dielectric composition consisting of:
    (a) 20-60 wt % acrylated urethane oligomer with a percent elongation of at least 100%;
    (b) 5-30 wt % alkyl acrylate monomer;
    (c) 1-15 wt % acrylated amine;
    (d) 5-35 wt % inorganic powder; and
    (e) free radical initiator;
wherein the wt % are based on the total weight of the polymer thick film UV-curable thermoformable dielectric composition.

8. The capacitive switch circuit of claim 7, wherein said alkyl acrylate monomer is an oxyethylated acrylate monomer and said inorganic powder is talc.

9. The capacitive switch circuit of claim 7, wherein said capacitive switch circuit has been thermoformed.

10. The capacitive switch circuit of claim 8, wherein said capacitive switch circuit has been thermoformed.

11. The capacitive switch circuit of claim 9, wherein said capacitive switch circuit has been subsequently subjected to an injection molding process.

12. The capacitive switch circuit of claim 10, wherein said capacitive switch circuit has been subsequently subjected to an injection molding process.

* * * * *